United States Patent
Botea et al.

(10) Patent No.: US 10,026,499 B2
(45) Date of Patent: Jul. 17, 2018

(54) MEMORY TESTING SYSTEM

(71) Applicant: Apple Inc., Cupertino, CA (US)

(72) Inventors: Dragos F. Botea, San Jose, CA (US); Bibo Li, San Jose, CA (US); Vijay M. Bettada, Fremont, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/369,670

(22) Filed: Dec. 5, 2016

(65) Prior Publication Data

US 2017/0084349 A1  Mar. 23, 2017

Related U.S. Application Data

(62) Division of application No. 14/495,506, filed on Sep. 24, 2014, now Pat. No. 9,514,842.

(51) Int. Cl.
| | |
|---|---|
| *G11C 7/10* | (2006.01) |
| *G11C 29/08* | (2006.01) |
| *G11C 8/06* | (2006.01) |
| *G11C 11/4093* | (2006.01) |
| *G11C 29/12* | (2006.01) |
| *G11C 29/02* | (2006.01) |
| *G11C 29/14* | (2006.01) |
| *G11C 7/00* | (2006.01) |
| *G11C 8/00* | (2006.01) |
| G11C 29/56 | (2006.01) |

(52) U.S. Cl.
CPC ............... *G11C 29/12* (2013.01); *G11C 7/00* (2013.01); *G11C 8/00* (2013.01); *G11C 29/021* (2013.01); *G11C 29/14* (2013.01); *G11C 7/10* (2013.01); *G11C 29/08* (2013.01); *G11C 2029/5602* (2013.01)

(58) Field of Classification Search
CPC . G11C 29/08; G11C 29/12; G11C 2029/5602; G11C 7/10
USPC ............................................. 365/189.17, 201
See application file for complete search history.

(56) References Cited

U.S. PATENT DOCUMENTS

| | | | | |
|---|---|---|---|---|
| 5,506,959 A | * | 4/1996 | Cockburn | G11C 29/10 365/201 |
| 5,859,991 A | * | 1/1999 | Narayan | G06F 9/30152 712/204 |
| 6,510,530 B1 | * | 1/2003 | Wu | G11C 29/10 714/30 |
| 6,651,201 B1 | * | 11/2003 | Adams | G01R 31/2891 714/733 |

(Continued)

*Primary Examiner* — Ly D Pham
(74) *Attorney, Agent, or Firm* — Meyertons, Hood, Kivlin, Kowert & Goetzel, P.C.

(57) ABSTRACT

Techniques are disclosed relating to memory testing. In one embodiment, an integrated circuit is disclosed that includes a memory and an interface circuit. The interface circuit is configured to receive one or more testing signals from a built in self-test (BIST) unit. The interface circuit is further configured to receive, independently from the one or more testing signals, one or more configuration signals from automated test equipment (ATE). The interface circuit is further configured to issue one or more instruction signals to the memory based on the one or more testing signals and based on the one or more configuration signals. In some embodiments, the interface circuit is configured to enable the BIST unit to detect errors in functions the BIST unit is not designed to test.

20 Claims, 4 Drawing Sheets

(56) References Cited

U.S. PATENT DOCUMENTS

| | | |
|---|---|---|
| 6,671,839 B1 | 12/2003 | Cote et al. |
| 6,771,549 B1 | 8/2004 | Konuk et al. |
| 7,257,745 B2 | 8/2007 | Huott et al. |
| 7,360,134 B1 | 4/2008 | Jacobson et al. |
| 7,778,105 B2 | 8/2010 | Golla et al. |
| 7,782,684 B2 | 8/2010 | Cha et al. |
| 7,940,066 B2 | 5/2011 | Jarboe, Jr. et al. |
| 2003/0037295 A1* | 2/2003 | Galzur ................... G11C 29/38 714/719 |
| 2004/0230870 A1 | 11/2004 | Wang et al. |
| 2005/0015671 A1 | 1/2005 | Parulkar et al. |
| 2006/0146622 A1 | 7/2006 | Mukherjee et al. |
| 2006/0168491 A1 | 7/2006 | Lee et al. |
| 2006/0218452 A1* | 9/2006 | Njinda ................... G11C 29/14 714/718 |
| 2006/0282732 A1 | 12/2006 | Kiryu |
| 2007/0050579 A1* | 3/2007 | Hall ........................ G05B 9/03 711/163 |
| 2008/0077835 A1 | 3/2008 | Khoche et al. |
| 2009/0009206 A1 | 1/2009 | Jarboe, Jr. et al. |
| 2010/0007366 A1 | 1/2010 | Watanabe et al. |
| 2011/0004793 A1 | 1/2011 | Sul et al. |
| 2011/0273197 A1 | 11/2011 | Banerjee et al. |
| 2012/0159274 A1 | 6/2012 | Balakrishnan et al. |
| 2012/0191400 A1 | 7/2012 | Sontakke et al. |
| 2013/0021048 A1 | 1/2013 | Peng et al. |
| 2013/0051158 A1* | 2/2013 | Matsuo ................... G11C 29/24 365/189.07 |
| 2013/0275824 A1 | 10/2013 | Tekumalla et al. |
| 2014/0078841 A1 | 3/2014 | Chopra |
| 2014/0217406 A1 | 8/2014 | Thomas |
| 2014/0225635 A1 | 8/2014 | Dasnurkar |
| 2014/0269021 A1* | 9/2014 | Yang ..................... G11C 11/419 365/154 |
| 2015/0262710 A1* | 9/2015 | Chakravarty .......... G11C 29/38 714/718 |
| 2016/0078965 A1* | 3/2016 | Boynapalli ............ G11C 29/08 714/719 |

* cited by examiner

MEMORY TESTING SYSTEM

The present application is a divisional of U.S. application Ser. No. 14/495,506, filed Sep. 24, 2014 (now U.S. Pat. No. 9,514,842); the disclosures of each of the above-referenced applications are incorporated by reference herein in their entireties.

BACKGROUND

Technical Field

This disclosure relates generally to a memory testing system.

Description of the Related Art

Memory devices typically store large amounts of data and are able to retrieve the data upon request. As modern memory devices include more storage and are expected to return data at a faster and faster rate, designs for the memory devices become more complex. Complex memory devices may be difficult to fabricate correctly. Additionally, complex memory devices may be more prone to failure during operation. Thus, memory devices may operate incorrectly.

A memory device may be tested (e.g., by a manufacturer) to determine whether the memory device correctly stores and retrieves data. One mechanism that may be used to test the memory device is a built in self-test (BIST). A BIST may enable the memory device to perform tests on itself to verify some or all of the internal functionality of the memory device. Some companies provide commercial BIST designs. Commercial BIST designs may be able to verify a set of functions of the memory device.

SUMMARY

In various embodiments, an integrated circuit is disclosed that includes a memory (e.g., a multi-port memory), a self-test unit (e.g., a built in self-test (BIST) unit), and an interface circuit. The self-test unit may have limited functionality by design and may not be designed to fully test the functions of the memory. The interface circuit may provide a test to the memory which differs from a test initiated by the self-test unit. The test provided by the interface circuit may cause the integrated circuit to test functions of the memory which the self-test unit is not designed to test.

For example, in one embodiment, the self-test unit receives a test request from automated test equipment (ATE). The self-test unit may transmit testing signals (e.g., corresponding to a "read all ports" instruction) to the interface circuit. The interface circuit may receive the testing signals and may also receive, independently from the testing signals, configuration signals from the ATE. The interface circuit may detect that the testing signals include a particular instruction. The interface circuit may issue instruction signals (e.g., signals corresponding to testing a double-pump write function of a multi-port memory) to the memory based on detecting the particular instruction and based on the configuration signals. The interface circuit may receive data signals from the memory and may format the data signals based on an expected signal configuration of the self-test unit. The interface circuit may forward the formatted data signals to the self-test unit, where the self-test unit may check the formatted data signals based on an expected result of the particular instruction. The instruction signals may be chosen such that a result of the instruction signals matches a result of the particular instruction. Thus, if the self-test unit detects an error in the formatted data signals, the ATE may determine that the memory failed to properly perform an action based on the instruction signals. Thus, the interface circuit may "override" or "hijack" a self-test instruction to test of a particular function of the memory and instead test a different function of the memory, which may correspond to a function the self-test unit is not designed to test.

Figure 1:
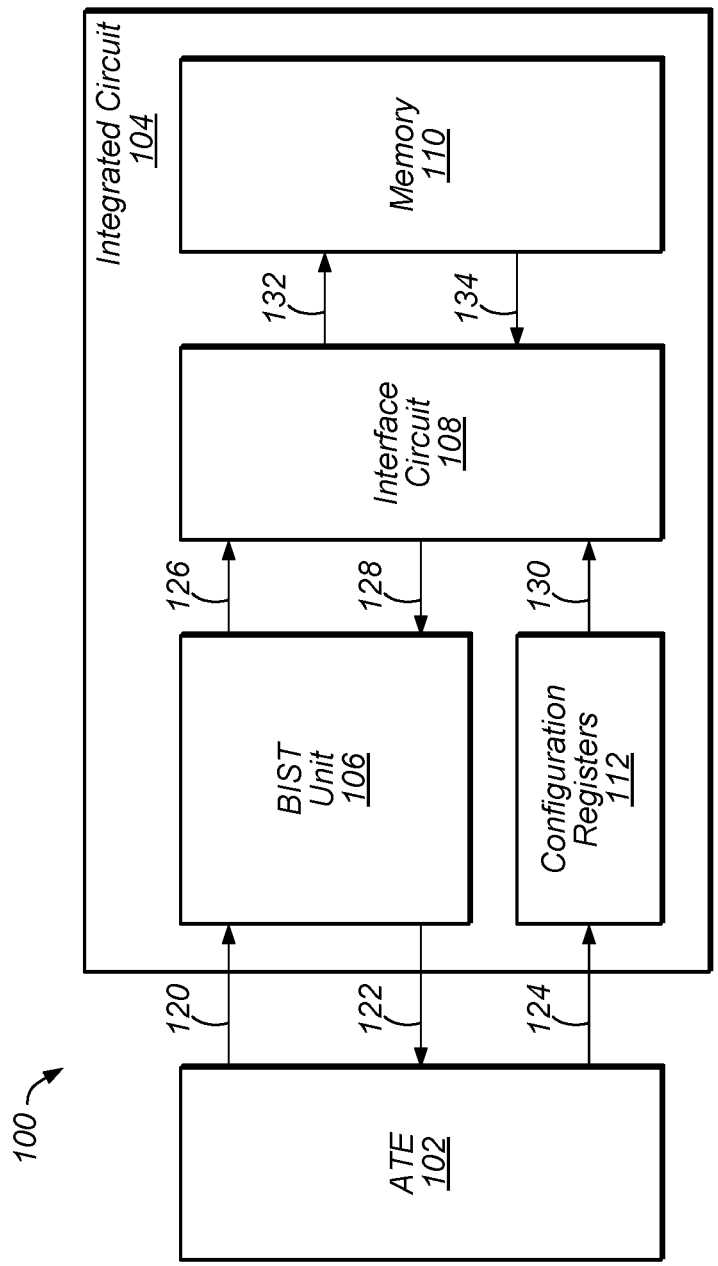
FIG. 1 is a block diagram illustrating one embodiment of an exemplary memory testing system.

This disclosure includes references to "one embodiment," "a particular embodiment," "some embodiments," or "an embodiment." The appearances of the phrases "in one embodiment," "in a particular embodiment," "in some embodiments," or "in an embodiment" do not necessarily refer to the same embodiment. Particular features, structures, or characteristics may be combined in any suitable manner consistent with this disclosure.

Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. § 112(f), for that unit/circuit/component. Additionally, "configured to" can include generic structure (e.g., generic circuitry) that is manipulated by software and/or firmware (e.g., an FPGA or a general-purpose processor executing software) to operate in a manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

As used herein, the term "based on" is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

As used herein, the term "set" is used to describe a group of one or more. Although this term can be used to describe a plurality, this term does not necessarily imply a plurality. That is, "a set of signals" can refer to one signal or more than one signal.

DETAILED DESCRIPTION

As described above, a commercial built in self-test (BIST) design may be able to verify a set of functions of a memory device. However, the commercial BIST design may be unable to verify some functions (e.g., a double-pump write function) of the memory device. Designing a custom BIST to test all functions of the memory device may be undesirably expensive. As will be discussed below, an interface circuit may be used to expand functionality of the commercial BIST design without redesigning the BIST.

This disclosure initially describes, with reference to FIG. 1, an overview of an exemplary memory testing system. The techniques and structures described herein, however, are in no way limited to the memory testing system shown in FIG. 1; rather, this context is provided only as one possible implementation. Embodiments of an exemplary interface circuit that implements memory testing are then described with references to FIGS. 2 and 3. Finally, an exemplary computing system is described with reference to FIG. 4.

Turning now to FIG. 1, a block diagram of an exemplary memory testing system 100 is shown. In the illustrated embodiment, the memory testing system 100 includes automated test equipment (ATE) 102 and an integrated circuit 104. In one embodiment, the integrated circuit 104 includes a BIST unit 106, an interface circuit 108, a memory 110, and one or more configuration registers 112. In other embodiments, the BIST unit 106, the interface circuit 108, the memory 110, the one or more configuration registers 112, or any combination thereof, are external to the integrated circuit 104. In another embodiment, the BIST unit 106, the interface circuit 108, the memory 110, the one or more configuration registers 112, or any combination thereof, may be connected differently (e.g., the BIST unit 106 may be configured to send at least some signals to the memory 110 without passing the signals through the interface circuit 108). The memory 110 may include additional circuitry beyond a set of memory cells (e.g., decoders, combinational logic).

In a particular embodiment, the BIST unit 106 has limited functionality by design (e.g., the BIST unit 106 is a generic, mass-produced self-test tool designed to test many types of memories). Other self-test tools may also be used. The BIST unit 106 may be unable to fully test the functions of the memory 110. For example, in one embodiment, the memory 110 is a double-pump memory device. As used herein, the term "double-pump memory" has its ordinary and accepted meaning in the art, and includes a memory that performs operations during a first clock phase (e.g., in response to a rising clock edge) and during a second clock phase (e.g., in response to a falling clock edge). A double-pump memory device may be configured to use multiple ports linked to common internal hardware to perform one or more double-pump functions (e.g., one or more double-pump write functions). As used herein, a "double-pump function" refers to an operation where a memory performs one or more memory functions (e.g., responding to a read request or performing a write) during a first phase of a clock cycle (e.g., when a clock signal is high) and performs one or more other memory functions during a second phase of the clock cycle (e.g., when the clock signal is low). As used herein, a "double-pump write function" is a double-pump function in which a first write operation is performed during a first phase of a clock cycle and a second write operation is performed during a second phase of a clock cycle. In the example, the BIST unit 106 may be unable to request more than one memory function during each clock cycle. However, the interface circuit 108 may be configured to override an instruction from the BIST unit 106 with an instruction that tests one or more double-pump write functions of the memory 110. As further described below, the interface circuit 108 may format one or more data signals 134 received from the memory 110 as part of testing the one or more double-pump write functions such that the BIST unit 106 detects whether the memory 110 correctly performs the one or more double-pump write functions. Although a double-pump memory is described herein, the interface circuit 108 may also be used to test other kinds of memories (e.g., quad-pump memories) that the BIST unit 106 is unable to fully test. Further, although a BIST unit (e.g., the BIST unit 106) is specified herein, other self-test tools may be used. Additionally, although one or more double-pump write functions are specified herein, other memory functions such as other double-pump functions may be tested.

The ATE 102 may control testing of the memory 110. In one embodiment, the ATE 102 may be directly controlled by a user or a device manufacturer. The ATE 102 may be configured to initiate one or more tests of one or more functions of the memory 110. For example, the ATE 102 may be configured to transmit one or more initiation signals 120 to the BIST unit 106. The one or more initiation signals 120 may include a request that the BIST unit 106 transmit one or more instructions to the memory 110 (e.g., as part of the one or more tests). Further, the ATE 102 may be configured to provide one or more control signals 124 to the one or more configuration registers 112. The one or more control signals 124 may correspond to an override instruction, which may cause the interface circuit 108 to override an instruction sent from the BIST unit 106 to the memory 110. In a particular embodiment, the one or more control signals 124 are transmitted independently of the one or more initiation signals 120. Thus, in the particular embodiment, the BIST unit 106 may be unaware of the one or more control signals 124. As described in more detail below, the BIST unit 106 may determine whether an executed instruction (e.g., the one or more instructions or the override instruction) was executed correctly by the memory 110. The BIST unit 106 may provide a result 122 to the ATE 102, which indicates whether the executed instruction was executed correctly. In one embodiment, the ATE 102 may provide data indicative of the result 122 to a user. Although an ATE device (e.g., the ATE 102) is specified herein, other methods of managing a device testing process may be used.

The BIST unit 106 may be configured to transmit, responsive to the one or more initiation signals 120, one or more of a set of tests to the memory 110. The BIST unit 106 may be further configured to detect whether the memory 110 completed each test of the set of tests correctly. Each test may include one or more sequences of instructions. Each sequence of instructions may include one instruction or more than one instruction. More generally, each instruction may be transmitted as one or more testing signals 126 to the interface circuit 108. In the particular embodiment, the BIST unit 106 receives one or more formatted data signals 128 in response to the one or more testing signals 126. As described in more detail below, the one or more formatted data signals 128 may include data resulting from the memory 110 executing the instruction corresponding to the one or more testing signals 126 (e.g., because the interface circuit 108 is operating in a pass through mode). The BIST unit 106 may perform one or more checks on the data received from the memory 110 (e.g., comparing the received data to an expected value of the received data to detect an error) to determine whether the memory 110 performed a corresponding sequence of instructions correctly. For example, the one or more checks may include performing a checksum algorithm to compare the data from the memory 110 or a permutation of the data from the memory 110 to an expected value. The BIST unit 106 may indicate (e.g., to the ATE 102) whether from the one or more formatted data signals 128 passed the one or more checks (e.g., via the result 122).

In various embodiments, the interface circuit 108 is configured to interface the BIST unit 106 with the memory 110 to facilitate the BIST unit 106 testing functionality of the memory 110. As will be described below, in some instances, this interfacing includes passing test instructions from the BIST unit 106 (conveyed via the one or more testing signals 126, in the illustrated embodiment) to the memory 110 and passing any resulting data (conveyed via the one or more data signals 134) back to the BIST unit 106. In other instances, however, the interface circuit 108 overrides instructions specified by BIST unit 106. This overriding may include changing the manner in which an instruction executes—e.g., by changing the ports and/or addresses specified by the instruction. This overriding may also include even changing an operation specified by the instruction—e.g., replacing a read instruction with a write instruction. (An instruction that replaces an instruction specified by the BIST unit 106 may be referred to below as an "override instruction.") As will be discussed, in various embodiments, the interface circuit 108 interfaces the BIST unit 106 with the memory 110 by formatting data received from the memory 110 in a manner that makes the data understandable by the BIST unit 106. For example, in one embodiment, interface circuit 108 rearranges data conveyed via the one or more data signals 134 and changes timing characteristics of the one or more data signals 134 to produce the one or more formatted data signals 128. In some embodiments, the BIST unit 106 is unaware of the interfacing being performed by the interface circuit 108.

In various embodiments, the ATE 102 provides configuration information to the interface circuit 108 that indicates whether the interface circuit 108 should override instructions from BIST unit 106 and, in some embodiments, how the overriding should be performed. In the illustrated embodiment, this configuration information is conveyed via the one or more control signals 124. In one embodiment, the one or more control signals 124 include an override indicator and one or more override data signals. The override indicator may cause the interface circuit 108 to selectively override an instruction sent from the BIST unit 106 to the memory 110. The one or more override data signals may indicate one or more override instructions to be performed when the interface circuit 108 overrides the instruction sent from the BIST unit 106 to the memory 110. The one or more override instructions may include one or more write instructions, one or more read instructions, or any combination thereof. The one or more override data signals may include one or more data patterns to be written to the memory 110 or may indicate a particular pattern (e.g., a pattern stored at the interface circuit 108 or a pattern generated by the interface circuit 108) to be written to the memory 110.

In the illustrated embodiment, the one or more configuration registers 112 are configured to receive the configuration information via the one or more control signals 124 from the ATE 102 (e.g., via one or more debug ports of the integrated circuit 104, such as a Joint Test Access Group (JTAG) interface). The one or more configuration registers 112 may be configured to store the control information and to provide the control information to the interface circuit 108 via one or more configuration signals 130. For example, the one or more configuration signals 130 may be provided to the interface circuit 108 as a set of static inputs during the execution of the one or more tests by the BIST unit 106. The one or more configuration signals may be provided to the interface circuit 108 independently of the one or more testing signals 126.

The interface circuit 108, as further described below with respect to FIG. 2, may be configured to selectively override (e.g., modify or replace) an instruction received from the BIST unit 106 and to cause the memory 110 to perform a different instruction. Further, the interface circuit 108 may address a different set of ports of the memory 110 than indicated by the BIST unit 106. Additionally, the interface circuit 108 may be configured to format data received from the memory 110 in a manner that makes the data understandable by the BIST unit 106. Causing the memory 110 to perform the different instruction and formatting the data received from the memory 110 may enable the integrated circuit 104 to test a function of the memory 110 and/or ports of the memory 110 which the BIST unit 106 is not designed to test.

More generally, the interface circuit 108 may be configured to, based on the one or more testing signals 126 and the one or more configuration signals 130, issue one or more instruction signals 132 to the memory 110. In one embodiment, the one or more instruction signals 132 instruct the memory 110 to perform a memory instruction indicated by the one or more testing signals 126. In another embodiment, the interface circuit 108 may enter an override mode based on detecting that the one or more testing signals 126 correspond to a particular instruction and detecting that the one or more configuration signals 130 include the override indicator. In a first embodiment, the interface circuit 108 may detect that the one or more testing signals 126 correspond to the particular instruction by decoding an opcode associated with the one or more testing signals 126 and by comparing the opcode to a particular opcode associated with the particular instruction. In a second embodiment, the interface circuit may detect that the one or more testing signals 126 correspond to the particular instruction by detecting that the one or more testing signals 126 indicate a set of enable signals corresponding to the particular instruction. In a third embodiment, the interface circuit 108 may receive an indication that the one or more testing signals 126 correspond to the particular instruction.

Accordingly, when the interface circuit 108 is in the override mode, the interface circuit 108 may be configured to override a first memory instruction with one or more other instructions (e.g., a second memory instruction that differs from the first memory instruction). Further, when the interface circuit 108 is in the override mode, the interface circuit 108 may be configured to address a second set of ports of the memory 110 (indicated by the one or more configuration signals 130) rather than a first set of ports of the memory 110 (indicated by the one or more testing signals 126). For example, the interface circuit 108 may be configured to replace a read all ports instruction (i.e., an instruction that requests performance of a read operation using each read port of the memory and does not request performance of a write operation) with a write instruction followed by a read instruction. In the example, the interface circuit 108 may detect that the one or more testing signals 126 specify a read all ports instruction. As noted above, the read all ports instruction may be detected, as an illustration, based on an opcode, a set of enable signals, or a received indication. The interface circuit 108 may be configured to issue the write instruction and the read instruction to the memory 110 as the one or more instruction signals 132 (i.e., instead of signals corresponding to the read all ports instruction). Additionally, the interface circuit 108 may address a second set of ports (i.e., a combination of read ports and write ports) of the memory 110 instead of all of the read ports of the memory 110 (i.e., as indicated by the read all ports instruction). Accordingly, the memory 110 may receive control signals corresponding to the read instruction and the write instruction instead of to the read all ports instruction. Although the example specifies a read all ports instruction, in other embodiments, other instructions to the memory 110 may be overridden.

The interface circuit 108 may be further configured to selectively format an output of the memory 110 to facilitate testing of the output by the BIST unit 106. More generally, the interface circuit 108 may receive one or more data signals 134 from the memory 110 in response to the one or more instruction signals 132. The one or more data signals 134 may include data produced as result of execution of one or more instructions specified by the one or more instruction signals 132. In a particular embodiment, when the interface circuit 108 has overridden an instruction specified by the one or more testing signals 126, the interface circuit 108 is configured to receive the one or more data signals 134 (e.g., corresponding to the second set of ports of the memory 110 as described in the example above) and format the one or more data signals 134 based on an expected signal configuration of the BIST unit 106 (e.g., corresponding to the first set of ports of the memory 110 as described in the example above). The one or more formatted data signals 128 may be transmitted from the interface circuit 108 to the BIST unit 106. For example, the one or more data signals 134 may be formatted such that if the memory 110 has correctly performed the one or more instructions provided by the interface circuit 108, the BIST unit 106 will determine that the test has passed (e.g., even though an instruction specified by the one or more testing signals 126 was not issued to the memory 110). Further, if the memory 110 fails to correctly perform one or more of the instructions specified by the one or more instruction signals 132, the one or more formatted data signals 128 may be formatted such that the BIST unit 106 will determine that the test has failed.

In another particular embodiment, when the instruction specified by the one or more testing signals 126 does not match an instruction specified by the one or more configuration signals 130 or when the one or more configuration signals 130 do not instruct the interface circuit 108 to override an instruction (e.g., the override indicator does not indicate an override mode), the interface circuit 108 is configured to pass the instruction specified by the one or more testing signals 126 through to the memory 110. For example, when the override indicator does not indicate the override mode, the interface circuit 108 may be configured to provide a read all ports instruction to the memory 110 as the one or more instruction signals 132. In the example, the interface circuit 108 may be further configured to provide the one or more data signals 134 to the BIST unit 106 as the one or more formatted data signals 128.

In an embodiment, the BIST unit 106 is aware (e.g., via an indication from the ATE 102) that the interface circuit 108 is configured to override one or more particular instructions. In the embodiment, the BIST unit 106 can issue the one or more testing signals 126 knowing that the interface circuit 108 will override the one or more testing signals 126 and cause the memory 110 to perform a different functionality. This may enable the BIST unit 106 to skip instructions in the test that will not be reflected in the test results (e.g., write instructions corresponding to data that will not be read). For example, the BIST unit 106 may issue a read all ports instruction without previously issuing a write instruction to the addressed memory locations of the memory 110. Ordinarily, issuing a read instruction addressing a memory location where data has not yet been written may cause an error from the memory 110, but if the interface circuit 108 overrides the read all ports with a write instruction and a read instruction, then the BIST unit 106 may be able to detect an error associated with the write instruction and the read instruction.

Figure 2:
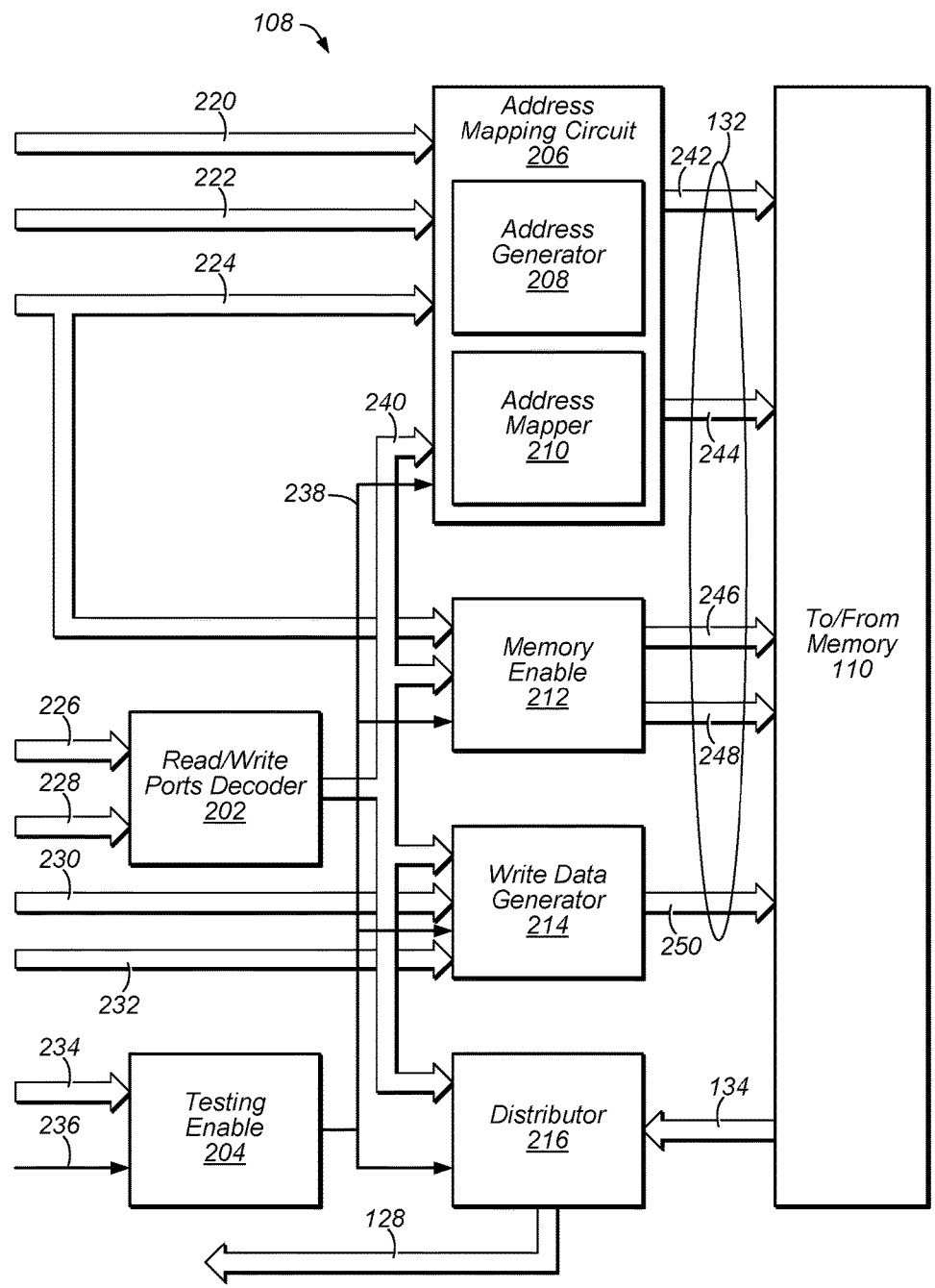
FIG. 2 is a block diagram illustrating one embodiment of an exemplary interface circuit.

Turning now to FIG. 2, a block diagram of an exemplary embodiment of the interface circuit 108 of FIG. 1 is shown. In the illustrated embodiment, the interface circuit 108 includes a read/write ports decoder 202, a testing enable circuit 204, an address mapping circuit 206, a memory enable circuit 212, a write data generator 214, and a distributor 216. In one embodiment, the address mapping circuit 206 includes an address generator 208 and an address mapper 210. In other embodiments, the interface circuit 108 may be configured differently (e.g., in one embodiment, the testing enable circuit 204 may be located outside the interface circuit 108). Further, some inputs, outputs, signals, or any combination thereof may be omitted in the illustrated embodiment for the sake of clarity.

As described above with reference to FIG. 1, the interface circuit 108 may be configured to override (e.g., replace or modify) one or more instructions received from the BIST unit 106. In one embodiment, the one or more testing signals 126 of FIG. 1 include one or more address signals 220 (e.g., a set of read addresses, a set of write addresses, or any combination thereof), one or more enable signals 224 (e.g., read enable signals, write enable signals, or any combination thereof), one or more write data signals 230, one or more instruction identifier signals 234, or any combination thereof. In one embodiment, the one or more configuration signals 130 of FIG. 1 (e.g., signals received at the interface circuit 108 from the one or more configuration registers 112) include one or more offset signals 222, one or more write control signals 226, one or more read control signals 228, one or more override write data signals 232, an override indicator 236, or any combination thereof. In other embodiments, signals may be received from different devices. For example, the override indicator 236 may be received from the BIST unit 106 of FIG. 1. In one embodiment, the one or more instruction signals 132 of FIG. 1 (e.g., signals provided from the interface circuit 108 to the memory 110) include one or more write addresses 242, one or more read addresses 244, one or more write enable signals 246, one or more read enable signals 248, one or more write signals 250, or any combination thereof.

In one embodiment, the read/write ports decoder 202 are configured to decode a set of desired ports to be addressed in the override mode and to indicate the set of desired ports to other elements of the interface circuit 108. More generally, the read/write ports decoder 202 may be configured to receive the one or more write control signals 226 and the one or more read control signals 228 (e.g., as part of the one or more configuration signals 130). The read/write ports decoder 202 may be configured to decode the one or more write control signals 226 and the one or more read control signals 228 into the set of desired ports. The read/write ports decoder 202 may be configured to issue a set of override control signals 240 indicative of the set of desired ports to one or more other devices of the interface circuit 108. Thus, the set of override control signals 240 may be issued based on the one or more write control signals 226, the one or more read control signals 228, or any combination thereof In the illustrated embodiment, the set of override control signals 240 is transmitted to the address mapping circuit 206, the memory enable circuit 212, the write data generator 214, and the distributor 216. In another embodiment, corresponding portions of the set of override control signals 240 are transmitted to the address mapping circuit 206, the memory enable circuit 212, the write data generator 214, and the distributor 216, respectively. When the interface circuit 108 is operating in the override mode, the set of override control signals 240 may be used to override an instruction received from the BIST unit 106, as described in more detail below.

In one embodiment, the testing enable circuit 204 is configured to determine whether the interface circuit 108 should override an instruction received from the BIST unit 106 and issues an override enable signal 238 that causes other elements of the interface circuit 108 to override the instruction. The testing enable circuit 204 may be configured to cause the interface circuit 108 enter an override mode based on the override indicator 236 and based on the testing enable circuit 204 detecting a particular instruction (e.g., a read all ports instruction) received from the BIST unit 106. In one embodiment, the testing enable circuit 204 detects the particular instruction using comparison logic configured to compare the one or more testing signals 126 of FIG. 1 (e.g., via the one or more instruction identifier signals 234) to a stored instruction identifier. In another embodiment, the testing enable circuit 204 detects the particular instruction by receiving an indication that the particular instruction has been received at the interface circuit 108. In response to detecting the particular instruction and based on the override indicator 236 indicating the override mode, the testing enable circuit 204 may be configured to generate the override enable signal 238.

In one embodiment, the address mapping circuit 206 is configured to generate a set of addresses to be used by the memory 110 when executing instructions. When the interface circuit 108 is operating in the override mode, the address mapping circuit 206 may be configured modify an address indicated by the BIST unit 106 and may convey the modified address to the memory. Accordingly, in the override mode, the address mapping circuit 206 may convey, to the memory, the modified address as the one or more write addresses 242, the one or more read addresses 244, or any combination thereof. When the interface circuit 108 is not operating in the override mode, the address mapping circuit 206 may provide addresses to the memory 110 as indicated by the BIST unit 106 without modification. Accordingly, the address mapping circuit 206 may convey, to the memory 110, an address indicated by the BIST unit 106 as one or more write addresses 242, one or more read addresses 244, or any combination thereof. Thus, in one embodiment, the address mapping circuit 206 is configured to selectively modify a first memory address included in the one or more testing signals 126 (e.g., a first set of test signals) using the one or more configuration signals 130 to generate a second (modified) memory address and to provide the second memory address to the memory 110 (e.g., included in a second set of test signals).

More generally, in the illustrated embodiment, the address mapping circuit 206 (via the address generator 208 and the address mapper 210) is configured to receive the one or more address signals 220, the one or more offset signals 222, and the one or more enable signals 224 and to produce one or more addresses for the memory 110. When the override enable signal 238 indicates the override mode, the address mapping circuit 206 may be configured to receive the one or more offset signals 222 from an external test circuit (e.g., via the one or more configuration registers 112). In the override mode, the address generator 208 may be configured to modify the one or more address signals 220 using the one or more offset signals 222 (e.g., by adding an offset indicated by the one or more offset signals 222 to an address indicated by the one or more address signals 220) to generate a set of modified addresses. For example, the set of modified addresses may correspond to a set of paired ports of the memory 110, where an address indicated by the one or more address signals 220 is paired with an address indicated by combining the one or more address signals 220 with the one or more offset signals 222. The address mapper 210 may be configured to provide the set of modified addresses, to one or more ports of the memory 110 specified by the set of override control signals 240. When the override enable signal 238 does not indicate an override mode, the one or more write addresses 242 and the one or more read addresses 244 may correspond to (e.g., match) the one or more address signals 220.

In a particular embodiment, the memory enable circuit 212 is configured to generate enable signals for the memory 110 when the interface circuit 108 is in the override mode. More generally, the memory enable circuit 212 is configured to receive one or more enable signals (e.g., the one or more enable signals 224 included in the one or more testing signals 126) and to receive override control signals (e.g., the set of override control signals 240). The memory enable circuit 212 may also be configured to receive the override enable signal 238. In the particular embodiment, when the override enable signal 238 indicates the override mode, the memory enable circuit 212 is configured to format the one or more enable signals 224 based on the set of override control signals 240 (e.g., an indication from the ATE 102 via the one or more configuration registers 112 and via the read/write ports decoder 202 specifying a set of ports of the memory 110). The formatted enable signals may be provided to the memory 110 as part of the one or more instruction signals 132 (e.g., via the one or more write enable signals 246, the one or more read enable signals 248, or any combination thereof) and may correspond to a different instruction than an instruction specified by the BIST unit 106 (e.g., via the one or more enable signals 224). The formatted enable signals may be generated using (e.g., by rerouting) the one or more enable signals 224. In the particular embodiment, when the override enable signal 238 does not indicate the override mode, the memory enable circuit 212 is configured to provide the one or more enable signals 224 (e.g., one or more read enable signals, one or more write enable signals, or any combination thereof) to the memory 110 (e.g., as part of the one or more instruction signals 132 via one or more write enable signals 246, one or more read enable signals 248, or any combination thereof).

In one embodiment, the write data generator 214 is configured to generate data signals for the memory 110 when the interface circuit 108 is in the override mode. More generally, the write data generator 214 is configured to receive one or more write data signals 230, one or more override write data signals 232, the override enable signal 238, the set of override control signals 240. When the override enable signal 238 indicates the override mode and the set of override control signals 240 indicate a write instruction, the write data generator 214 may be configured to provide override data to the memory 110 using the one or more write signals 250. In a first particular embodiment, the one or more override write data signals 232 include a desired data test pattern. In the first particular embodiment, the write data generator 214 is configured to provide the desired data test pattern to the memory 110 using the one or more write signals 250. In a second particular embodiment, the one or more override write data signals 232 indicate a desired data test pattern. In the second particular embodiment, the write data generator 214 is configured to generate the desired data test pattern and to provide the desired data test pattern to the memory 110 using the one or more write signals 250. For example, the one or more override write data signals 232 may indicate a fourth testing pattern. In the example, the write data generator 214 may detect the indication of the fourth testing pattern and determine that the fourth testing pattern is a checkerboard pattern. In the example, the write data generator 214 may generate the checkerboard pattern and may provide the checkerboard pattern to the memory 110 using the one or more write signals 250. Alternatively, during a write instruction, when the override enable signal 238 does not indicate the override mode, the write data generator 214 may be configured to provide the one or more write data signals 230 to the memory 110 using the one or more write signals 250 (e.g., as part of the one or more instruction signals 132).

In one embodiment, the distributor 216 is configured to, when the interface circuit 108 is in the override mode, format signals received from the memory 110 for the BIST unit 106. More generally, the distributor 216 is configured to receive the override enable signal 238, the set of override control signals 240, and the one or more data signals 134. When the override enable signal 238 indicates the override mode, the distributor 216 may be configured to format the one or more data signals 134 based on the set of override control signals 240. For example, the set of override control signals 240 may include a mapping between a first set of ports of the memory 110 and a second set of ports of the memory 110. In the example, the distributor 216 may be configured to receive the one or more data signals 134 from the second set of ports of the memory 110 and remap the one or more data signals 134 based on the first set of ports of the memory 110 to generate the one or more formatted data signals 128. As described above with reference to FIG. 1, the one or more formatted data signals 128 may be provided to the BIST unit 106. Thus, in the override mode, the one or more formatted data signals 128 may be formatted to appear as if they were generated by the memory 110 in response to the one or more testing signals 126 (even though a different instruction may have been performed). When the override enable signal 238 does not indicate the override mode, the distributor 216 may be configured to provide the one or more data signals 134 to the self-test unit as the one or more formatted data signals 128 (e.g., without modifying or altering the one or more data signals 134). Accordingly, an output of the self-test unit (e.g., the result 122 of FIG. 1) may correctly indicate whether an error occurred in response to the test.

Thus, in the illustrated embodiment, the interface circuit 108 is configured to receive a first set of test signals (e.g., the one or more testing signals 126) from a self-test unit (e.g., the BIST unit 106), detect (e.g., using the testing enable circuit 204) that the first set of test signals specify a particular instruction (e.g., a read all ports instruction), and in response to the detecting, override the particular instruction by sending a second set of test signals (e.g., included in the one or more instruction signals 132) to the memory 110 that modify the particular instruction.

In one embodiment, the interface circuit 108 is further configured to receive one or more configuration signals (e.g., the one or more configuration signals 130) from an external test circuit (e.g., from the ATE 102 via the one or more configuration registers 112). The particular instruction may be overridden based on the one or more configuration signals indicating an override mode (e.g., via the override indicator 236). In some embodiments, in response to the one or more configuration signals failing to indicate the override mode (e.g., via the override indicator 236), the interface circuit 108 is configured to initiate providing the first set of test signals to the memory 110. In some embodiments, the interface circuit 108 (e.g., using the testing enable circuit 204) is configured to detect that the first set of test signals specify a different instruction than the particular instruction. In response to the detecting that the first set of test signals specify the different instruction, the interface circuit 108 may be configured to initiate providing the first set of test signals to the memory 110.

Figure 3:
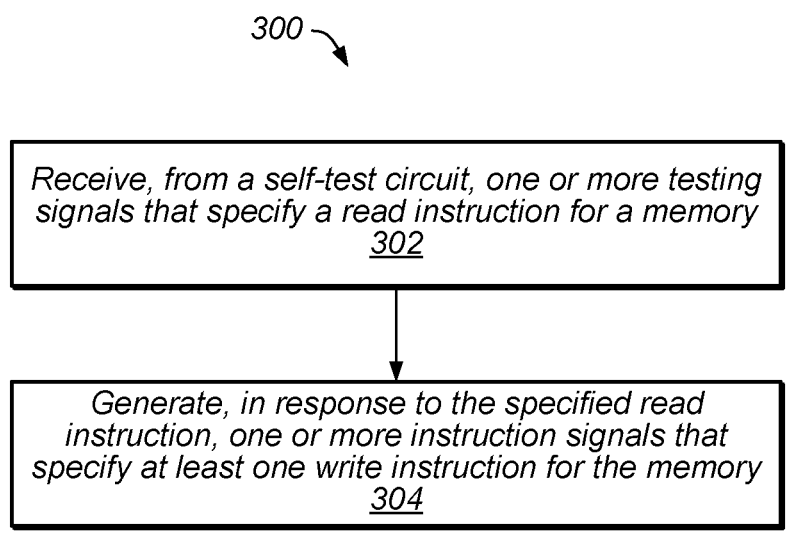
FIG. 3 is a flow diagram illustrating one embodiment of a method for testing a memory.

Turning now to FIG. 3, a flow diagram of a method 300 is depicted. Method 300 is one embodiment of a method that may be performed by an interface circuit such as the interface circuit 108. In some embodiments, performance of the method 300 may enable testing of functionality of a device (e.g., the memory 110) using generic testing hardware that cannot otherwise test the functionality.

At 302, the method 300 includes receiving, from a self-test circuit, one or more testing signals. The one or more testing signals may specify a read instruction for a memory. In a particular embodiment, the interface circuit 108 receives, from the BIST unit 106, the one or more testing signals 126 that specify a read instruction for the memory 110. In some embodiments, the memory includes more than one read port and the read instruction includes a read all ports instruction. The read all ports instruction may request performance of a read operation using each read port of the memory.

At 304, the method 300 includes generating, in response to the specified read instruction, one or more instruction signals that specify at least one write instruction for the memory. In the particular embodiment, the interface circuit 108 generates the one or more instruction signals 132 that specify at least one write instruction for the memory 110.

In some embodiments, the method 300 also includes providing one or more data signals to the self-test circuit in response to the one or more testing signals. The one or more data signals may be generated by the memory in response to the one or more instruction signals. For example, the interface circuit 108 may provide the one or more formatted data signals 128 to the BIST unit 106 in response to the one or more testing signals 126. The one or more formatted data signals 128 may be generated by the memory 110 in response to the one or more instruction signals 132. In a particular embodiment (e.g., when the interface circuit 108 is in the override mode), the one or more formatted data signals 128 are formatted by the interface circuit 108 prior to being sent to the BIST unit 106.

In some embodiments, the method 300 also includes receiving, from an external test circuit, one or more configuration signals that specify information usable by the memory to perform the at least one write instruction. For example, the interface circuit 108 may receive, from the ATE 102 (e.g., via the one or more configuration registers 112), the one or more configuration signals 130 that specify information (e.g., one or more write data signals, one or more enable signals, the one or more address signals, or other signals received by the interface circuit 108) usable by the memory 110 to perform the at least one write instruction. In one embodiment, the one or more configuration signals specify a bit pattern to be used during execution of the at least one write instruction. To illustrate, the one or more configuration signals 130 may specify a checkerboard pattern (e.g., alternating 1s and 0s) to be stored at a particular address of the memory 110. In the one embodiment, generating the one or more instruction signals includes generating a data signal in accordance with the bit pattern. In the illustration, the one or more instruction signals 132 (e.g., using the one or more write enable signals 246 and the one or more write signals 250) are generated in accordance with the checkerboard pattern. In the one embodiment, the at least one write instruction causes the memory to store data specified in the data signal. In the illustration, the at least one write instruction causes the memory 110 to store the checkerboard pattern (e.g., at an addressed set of memory locations). In the one embodiment, the one or more configuration signals specify a set of write ports of the memory to be used during the execution of the at least one write instruction. In the illustration, the one or more configuration signals 130 specify (e.g., via the one or more write control signals 226) a set of write ports of the memory 110 to be used during the execution of the at least one write instruction. In a particular embodiment, the one or more instruction signals also include one or more read instructions (e.g., a read instruction and a write instruction). The one or more read instructions may cause the memory to provide the data specified in the data signal. In the illustration, one or more read instructions included in the one or more configuration signals 130 may cause the memory 110 to provide data (e.g., via the one or more data signals 134) specified by the one or more instruction signals 132 (e.g., using the one or more read enable signals 246).

Figure 4:
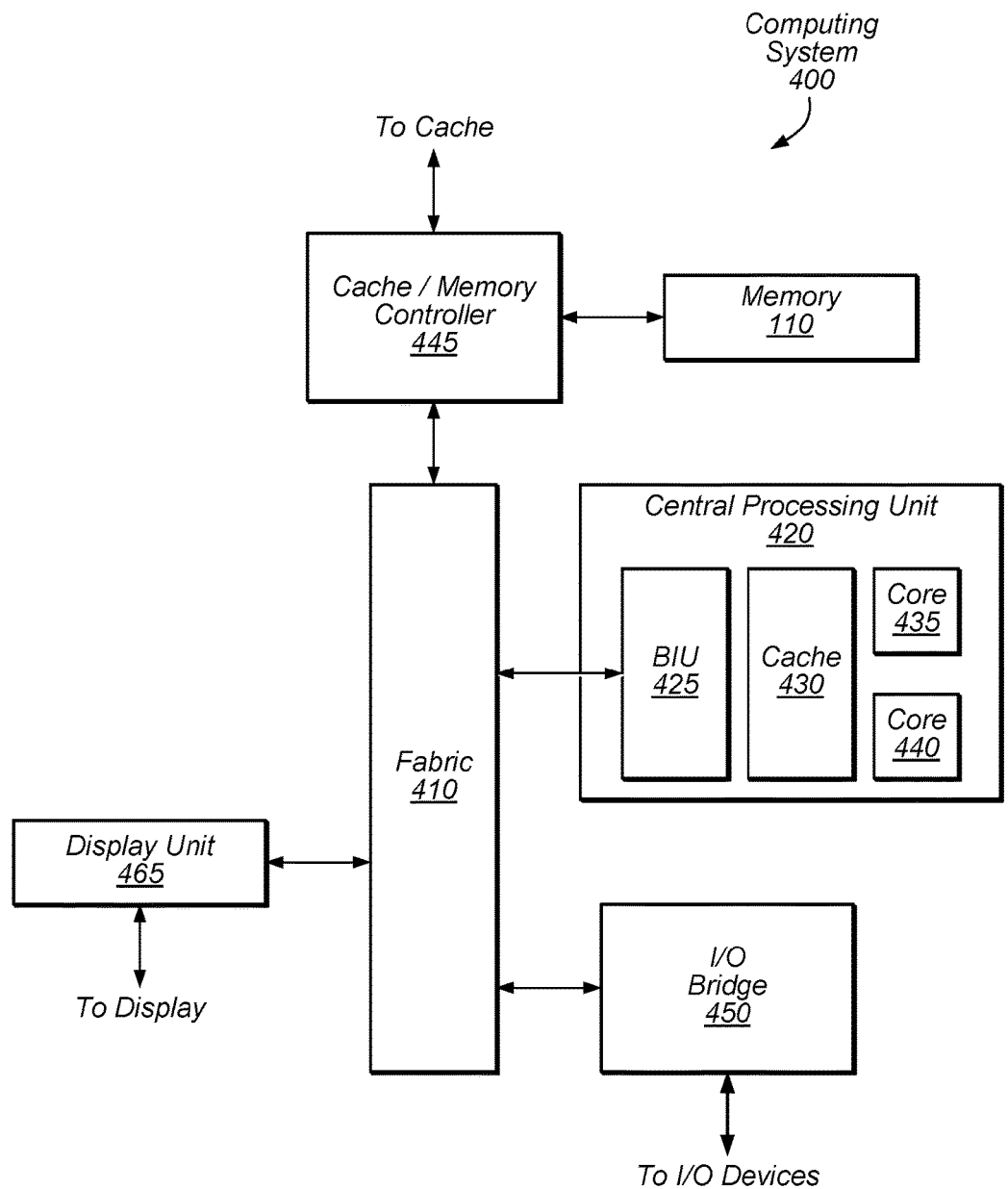
FIG. 4 is a block diagram illustrating one embodiment of an exemplary computing system.

Turning next to FIG. 4, a block diagram illustrating an exemplary embodiment of a computing system 400 is shown. Computing system 400 is one embodiment of a computing system that includes the memory 110 discussed above. In some embodiments, elements of computing system 400 may be included within a system on a chip (SoC) (e.g., the integrated circuit 104). In some embodiments, computing system 400 is included in a mobile device, which may be battery-powered. Therefore, power consumption by computing system 400 may be an important design consideration. In the illustrated embodiment, computing system 400 includes fabric 410, central processing unit (CPU) 420, input/output (I/O) bridge 450, cache/memory controller 445, memory 110, and display unit 465.

Fabric 410 may include various interconnects, buses, MUX's, controllers, etc., and may be configured to facilitate communication between various elements of computing system 400. In some embodiments, portions of fabric 410 are configured to implement various different communication protocols. In other embodiments, fabric 410 implements a single communication protocol and elements coupled to fabric 410 may convert from the single communication protocol to other communication protocols internally.

In the illustrated embodiment, CPU 420 includes bus interface unit (BIU) 425, cache 430, and cores 435 and 440. In various embodiments, CPU 420 includes various numbers of cores and/or caches. For example, CPU 420 may include 1, 2, or 4 processor cores, or any other suitable number. In one embodiment, cache 430 is a set associative L2 cache. In some embodiments, cores 435 and/or 440 include internal instruction and/or data caches. In some embodiments, a coherency unit (not shown) in fabric 410, cache 430, or elsewhere in computing system 400 is configured to maintain coherency between various caches of computing system 400. BIU 425 may be configured to manage communication between CPU 420 and other elements of computing system 400. Processor cores such as cores 435 and 440 may be configured to execute instructions of a particular instruction set architecture (ISA), which may include operating system instructions and user application instructions.

Cache/memory controller 445 may be configured to manage transfer of data between fabric 410 and one or more caches and/or memories. For example, cache/memory controller 445 may be coupled to an L3 cache, which may, in turn, be coupled to a system memory. In the illustrated embodiment, cache/memory controller 445 is directly coupled to the memory 110. In other embodiments, the cache/memory controller 445 is coupled to the memory 110 via one or more caches. In some embodiments, the cache/memory controller 445 includes one or more internal caches. In another embodiment, other memories are also coupled to the cache/memory controller 445.

As used herein, the term "coupled to" may indicate one or more connections between elements, and a coupling may include intervening elements. For example, in FIG. 4, display unit 465 may be described as "coupled to" the memory 110 through fabric 410 and cache/memory controller 445. In contrast, in the illustrated embodiment of FIG. 4, display unit 465 is "directly coupled" to fabric 410 because there are no intervening elements.

Display unit 465 may be configured to read data from a frame buffer and provide a stream of pixel values for display. Display unit 465 may be configured as a display pipeline in some embodiments. Additionally, display unit 465 may be configured to blend multiple frames to produce an output frame. Further, display unit 465 may include one or more interfaces (e.g., MIPI® or embedded display port (eDP)) for coupling to a user display (e.g., a touchscreen or an external display).

I/O bridge 450 may include various elements configured to implement: universal serial bus (USB) communications, security, audio, and/or low-power always-on functionality, for example. I/O bridge 450 may also include interfaces such as pulse-width modulation (PWM), general-purpose input/output (GPIO), serial peripheral interface (SPI), and/or inter-integrated circuit (I2C), for example. Various types of peripherals and devices may be coupled to computing system 400 via I/O bridge 450.

* * *

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method, comprising:
receiving, from a self-test circuit, one or more testing signals that specify a read instruction for a memory; and
in response to receiving the one or more testing signals, overriding the specified read instruction by generating one or more instruction signals that specify at least one write instruction for the memory.

2. The method of claim 1, further comprising providing one or more data signals to the self-test circuit in response to the one or more testing signals, wherein the one or more data signals are generated by the memory in response to the one or more instruction signals.

3. The method of claim 1, further comprising receiving, from an external test circuit, one or more configuration signals that specify information usable by the memory to perform the at least one write instruction.

4. The method of claim 3, wherein the one or more configuration signals specify a bit pattern to be used during execution of the at least one write instruction, wherein generating the one or more instruction signals comprises generating a data signal in accordance with the bit pattern, wherein the at least one write instruction causes the memory to store data specified in the data signal, and wherein the one or more configuration signals specify a set of write ports of the memory to be used during the execution of the at least one write instruction.

5. The method of claim 4, wherein the one or more instruction signals further comprise one or more read instructions, wherein the one or more read instructions cause the memory to provide the data specified in the data signal.

6. The method of claim 1, wherein the memory comprises a plurality of read ports, wherein the read instruction comprises a read all ports instruction, and wherein the read all ports instruction requests performance of a read operation using each read port of the memory.

7. An integrated circuit, comprising:
a self-test unit configured to test operation of a memory by sending a first set of test signals; and
an interface circuit configured to:
receive one or more configuration signals;
determine that the one or more configuration signals indicate an override mode;
receive the first set of test signals from the self-test unit;
detect that the first set of test signals specify a particular instruction; and
in response to the detecting and the determining, override the particular instruction by sending a second set of test signals to the memory that modify the particular instruction.

8. The integrated circuit of claim 7, wherein the one or more configuration signals are received from an external test circuit, and wherein the interface circuit is further configured to:
in response to the one or more configuration signals failing to indicate the override mode, initiate providing the first set of test signals to the memory;
detect that the first set of test signals specify a different instruction than the particular instruction; and
in response to the detecting that the first set of test signals specify the different instruction, initiate providing the first set of test signals to the memory.

9. The integrated circuit of claim 8, wherein the one or more configuration signals are received from the external test circuit via a register written to by the external test circuit.

10. The integrated circuit of claim 7, wherein the interface circuit comprises:
an address mapping circuit configured to:
receive one or more address signals included in the first set of test signals, wherein the address signals specify a first memory address of the memory;
receive one or more offset signals from an external test circuit, wherein the offset signals specify an offset to be applied to the first memory address; and
modify the first memory address based on the offset to produce a second memory address, wherein the second set of test signals specify the second memory address.

11. The integrated circuit of claim 7, wherein the interface circuit comprises:
a memory enable circuit configured to:
receive a first set of enable signals included in the first set of test signals;
receive an indication specifying a set of ports of the memory; and
based on the first set of enable signals, provide a second set of enable signals to the specified set of ports.

12. The integrated circuit of claim 7, wherein the interface circuit comprises:
a write data generator circuit configured to:
receive, from an external test circuit, an indication of a desired data test pattern; and
provide the desired data test pattern to the memory, wherein the second set of test signals include the desired data test pattern.

13. The integrated circuit of claim 7, wherein the interface circuit comprises:
a distributor circuit configured to:
receive a set of control signals from an external test circuit that map a first set of ports of the memory to a second set of ports of the memory;
receive one or more data signals from the second set of ports of the memory;
format the one or more data signals based on the set of control signals; and
provide the one or more data signals to the self-test unit in response to the first set of test signals.

14. An apparatus, comprising:
a memory; and
an interface circuit configured, in response to receiving, from a built in self-test (BIST) unit, one or more testing signals that specify a particular read instruction for the memory, to override the particular read instruction by generating one or more instruction signals that specify a write instruction and a read instruction for the memory.

15. The apparatus of claim 14, wherein the memory is configured to output one or more data signals in response to the one or more instruction signals, and
wherein the interface circuit is further configured, in response to receiving the one or more data signals, to format the one or more data signals based on an expected signal configuration of the BIST unit.

16. The apparatus of claim 14, wherein the one or more testing signals address a first set of ports of the memory, and wherein the one or more instruction signals address a second set of ports of the memory.

17. The apparatus of claim 14, wherein the interface circuit is further configured to receive one or more configuration signals from automated test equipment (ATE), and wherein the write instruction and the read instruction are generated based on the one or more configuration signals.

18. The apparatus of claim 17, wherein the one or more configuration signals indicate an instruction type of the particular read instruction, and wherein the interface circuit is configured to generate the one or more instruction signals in response to identifying the particular read instruction as having the instruction type.

19. The apparatus of claim 14, wherein the memory is a double-pump memory.

20. The apparatus of claim 19, wherein the one or more instruction signals request a test of a double-pump write function of the double-pump memory, wherein the double-pump write function causes the double-pump memory to perform a first write operation during a first phase of a clock cycle and to perform a second write operation during a second phase of the clock cycle.

* * * * *